(12) United States Patent
Knee et al.

(10) Patent No.: US 12,081,278 B2
(45) Date of Patent: Sep. 3, 2024

(54) TRANSMITTING FREQUENCY MULTIPLEXED SIGNALS FROM A SUPERCONDUCTING DOMAIN

(71) Applicant: Microsoft Technology Licensing, LLC, Redmond, WA (US)

(72) Inventors: Derek Leslie Knee, Fort Collins, CO (US); John Murray Hornibrook, Sydney (AU); Ian Douglas Conway Lamb, Coogee (AU); Richard Prescott Rouse, Kirkland, WA (US); David John Reilly, Sydney (AU)

(73) Assignee: Microsoft Technology Licensing, LLC, Redmond, WA (US)

( * ) Notice: Subject to any disclaimer, the term of this patent is extended or adjusted under 35 U.S.C. 154(b) by 645 days.

(21) Appl. No.: 17/316,523

(22) Filed: May 10, 2021

(65) Prior Publication Data
US 2022/0360342 A1    Nov. 10, 2022

(51) Int. Cl.
*H04B 10/70* (2013.01)
*G01R 33/035* (2006.01)
*G06N 10/00* (2022.01)
*H03K 19/195* (2006.01)

(52) U.S. Cl.
CPC ......... *H04B 10/70* (2013.01); *G01R 33/0354* (2013.01); *G06N 10/00* (2019.01); *H03K 19/195* (2013.01)

(58) Field of Classification Search
CPC .... H04B 10/70; G01R 33/0354; G06N 10/00; G06N 10/40; H03K 19/195; H03K 3/38; H03K 19/1952

USPC ........ 712/1, 203; 257/31; 365/148; 327/528; 977/774, 933
See application file for complete search history.

(56) References Cited

FOREIGN PATENT DOCUMENTS

EP    3266063 B1    3/2020

OTHER PUBLICATIONS

Quantum-classical interface based on single flux quantum digital logic, McDermott et al, Quantum Sci. Technol. 3 (2018) 024004 (Year: 2018).*

(Continued)

*Primary Examiner* — Arnold M Kinkead
(74) *Attorney, Agent, or Firm* — Alleman Hall & Tuttle LLP

(57) ABSTRACT

A circuit configured to transmit frequency multiplexed signals from a superconducting domain to a higher temperature domain. The circuit comprising a multiplexed signal output and a plurality of superconducting oscillator circuits each configured to output a different carrier frequency, each superconducting oscillator circuit comprising an oscillator output connected to the multiplexed signal output. Each superconducting oscillator circuit comprising a converter stage configured to convert an input of a superconducting logic signal to a Single Flux Quantum (SFQ) bit value, a splitter stage electrically connected to an output of the converter stage, the splitter stage configured to change between a first current state and a second current state based at least in part on the SFQ bit value, and an oscillator stage magnetically coupled to an output of the splitter stage and electrically coupled to the oscillator output. The oscillator stage comprising a direct current superconducting quantum interference device (DC SQUID).

20 Claims, 10 Drawing Sheets

(56) References Cited

OTHER PUBLICATIONS

"International Search Report and Written Opinion Issued in PCT Application No. PCT/US2022/018912", Mailed Date: Jul. 1, 2022, 21 Pages.

Whittaker, et al., "A Frequency and Sensitivity Tunable Microresonator Array for High-Speed Quantum Processor Readout", In Journal of Applied Physics, vol. 119, Issue 1, Jan. 7, 2016, 7 Pages.

* cited by examiner

TRANSMITTING FREQUENCY MULTIPLEXED SIGNALS FROM A SUPERCONDUCTING DOMAIN

BACKGROUND

Superconducting computers use circuit elements made from superconductors, which are materials that conduct electrical current without resistance when cooled to sufficiently low temperatures. Superconducting computing may offer advantages with regard to speed and power consumption compared to ordinary computing circuitry.

SUMMARY

Examples are disclosed that relate to circuitry for communicating between a superconducting computing domain and a higher temperature computing domain. One example provides a circuit configured to transmit frequency multiplexed signals from a superconducting domain to a higher temperature domain. The circuit comprises a plurality of superconducting oscillator circuits each configured to output a different carrier frequency, each superconducting oscillator circuit comprising an oscillator output connected to a multiplexed signal output. Each superconducting oscillator circuit comprises a converter stage configured to convert an input of a superconducting logic signal to a Single Flux Quantum (SFQ) bit value, a splitter stage electrically connected to an output of the converter stage, the splitter stage configured to change between a first current state and a second current state based at least in part on the SFQ bit value, and an oscillator stage magnetically coupled to an output of the splitter stage and electrically coupled to the multiplexed circuit output. The oscillator stage comprises a direct current superconducting quantum interference device (DC SQUID). In some examples, the superconducting logic signal can be based on Reciprocal Quantum Logic (RQL).

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
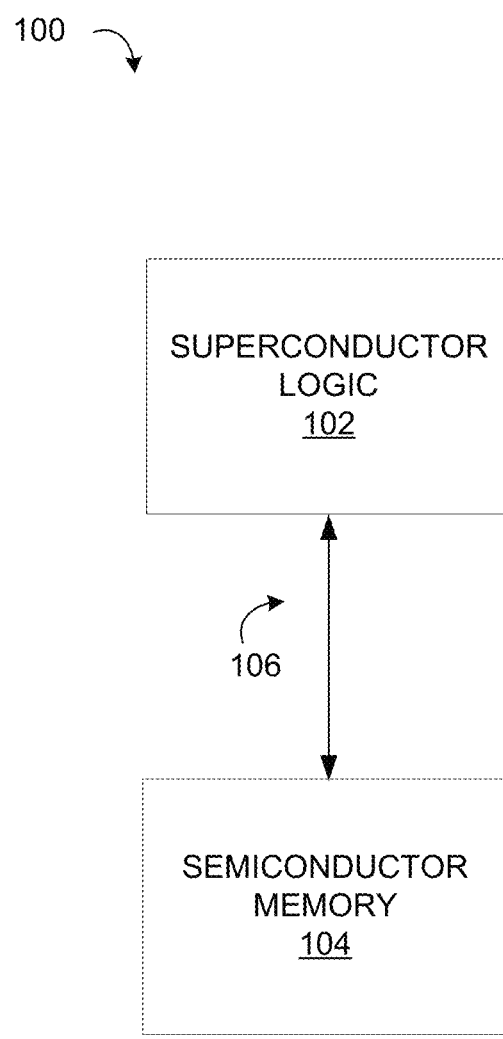
FIG. 1 shows a block diagram of an example computing system utilizing superconducting logic and semiconductor memory.

As mentioned above, superconducting computing may offer advantages with regard to speed and power consumption compared to ordinary computing circuitry. Logical bit values in superconducting computing may be encoded with various technologies, including Reciprocal Quantum Logic (RQL) technology. While superconducting computing offers the potential for high clock speeds, currently there is no suitably high-density memory for native inclusion within the superconducting domain. This lack of memory availability is a bottleneck for a superconducting computing system. As high-density memory has a possible impact on the performance of a computing system, the lack of availability of high-density memory may negatively impact the potential upside of superconducting computing logic running at a high clock speed.

One possible solution is to create a hybrid computing system that utilizes current high-density semiconductor memory paired with superconducting logic. One example of a complementary metal-oxide (CMOS) semiconductor memory is DRAM memory technologies, such as DDR SDRAM. However, such a hybrid computing system poses various challenges. One such challenge is transmitting encoded logical bit information between the two temperature domains of superconductor logic and semiconductor logic. Semiconductor logic encodes logical bit values via the use of charges and voltages within the CMOS logic, whereas superconductor logic encodes logical bit values via magnetic flux and currents within the superconductor logic. Another challenge is thermal radiation from power dissipation in the semiconductor memory, which may impact the cold temperatures needed in the superconductor domain. Physical separation between the superconductor logic and the semiconductor memory can be used address this problem, but metallic interconnects between the lower-temperature superconducting computing and higher temperature semiconductor logic domains can be one of the main thermal conduction paths between domains in such a multi-temperature system. Hence, any reduction in the interconnect conductor count offers thermal energy advantages.

Accordingly, examples are disclosed that relate to a superconducting circuit that generates a plurality of alternating current (AC) signals each at a different frequency and each encoding logical bit values from the superconducting logic. The circuit multiplexes the plurality of AC signals onto a multiplexed signal output. In the higher-temperature domain, the AC signals are demultiplexed and logical bit values are decoded. The use of a frequency multiplexed output helps to reduce thermal conductivity between domains, which may help to avoid heating the superconducting domain, as a frequency multiplexed output utilizes fewer metallic interconnections between the higher temperature and lower temperature domains compared to an un-multiplexed output. In some implementations, the disclosed examples may provide for a multiplexing of 32 different frequencies to achieve 8 Gbps (gigabytes per second) throughput, with a 6 ns (nanoseconds) end-to-end latency. While the disclosed examples each illustrate a single output onto which the signals are frequency multiplexed, in other examples two or more outputs may be used, wherein one or more of the outputs carries a frequency multiplexed signal.

FIG. 1 shows an example hybrid computing system 100 comprising superconductor logic 102 connected to semiconductor memory system 104 in a higher temperature domain. As explained in more detail below, an output of the superconductor logic 102 generates frequency multiplexed signals representative of logical bit values produced by other circuitry of the superconductor logic 102. The semiconductor memory system 104 comprises decoder logic to decode the frequency multiplexed signals into associated bit values that are in a form that can be understood by the semiconductor memory system 104, such as voltages or charges. In some examples, the superconductor logic 102 may operate at approximately 4K, whereas the semiconductor memory system 104 may operate at approximately 77K. In other examples, the superconducting domain and/or the semiconductor memory system may operate at any other suitable temperatures.

Figure 2:
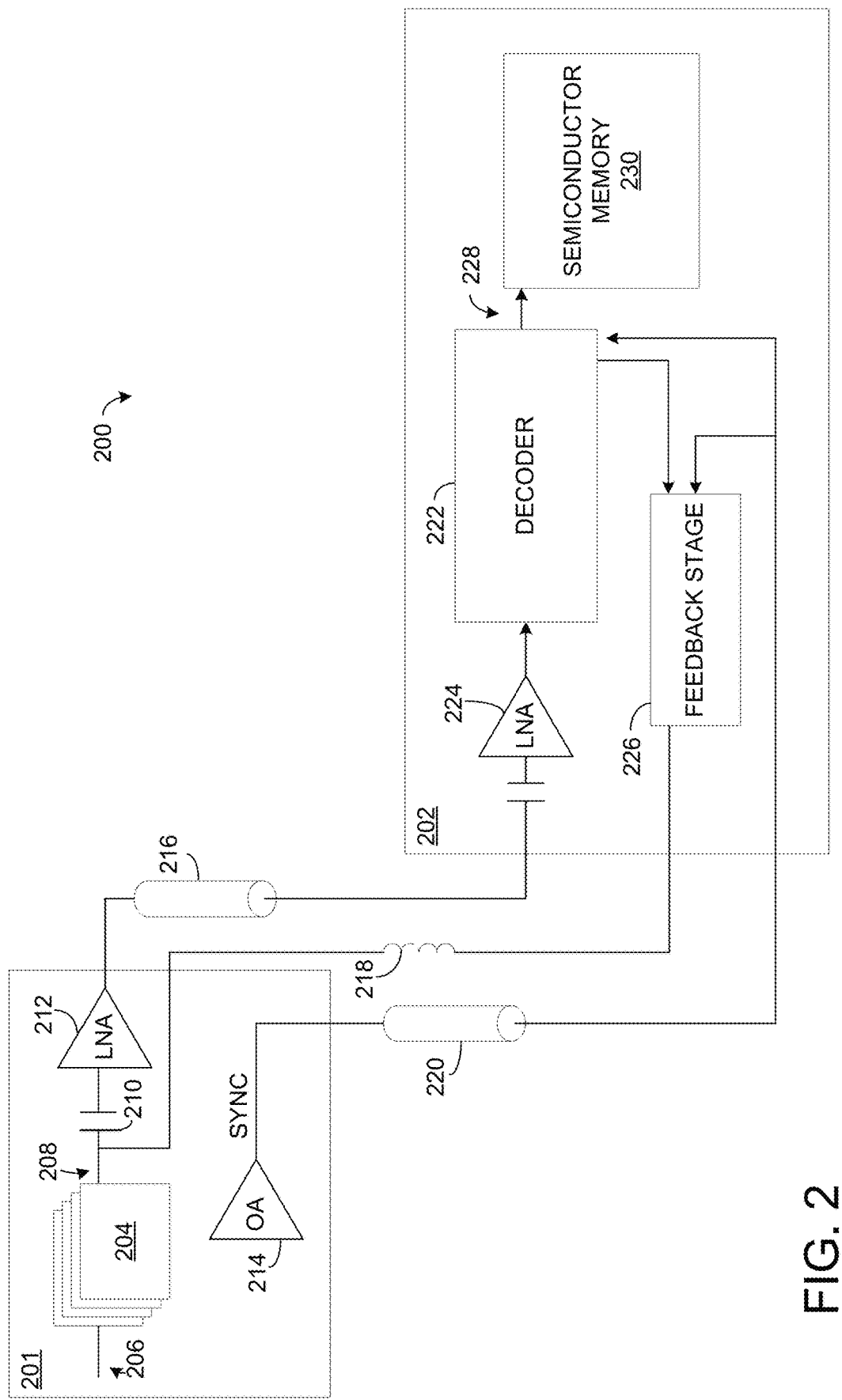
FIG. 2 shows a block diagram of an example multiplexed signal generator and corresponding decoder.

FIG. 2 shows a block diagram 200 illustrating an example circuit configured to generate and transmit frequency multiplexed signals from a superconducting domain 201 to a higher temperature domain 202. Circuit 200 can be implemented as part of hybrid computing system 100. The higher temperature domain 202 may comprise a semiconductor memory system 230 and further comprises semiconductor logic that is configured to decode signals from the superconducting domain 201 for the semiconductor memory system 230. Semiconductor logic in the higher temperature domain 202 connects to the superconducting domain 201 via a transmission line 216. Transmission line 216 can be a coaxial cable, flex micro-strip cable, or strip line, as examples.

The superconducting domain 201 comprises a plurality of oscillator circuits 204, wherein each oscillator circuit 204 comprises an oscillator output connected to a multiplexed signal output 208. Each of the plurality of oscillator circuits is configured to output an alternating current (AC) signal comprising a different carrier frequency. Each AC signal generated is multiplexed onto the multiplexed signal output 208, creating frequency multiplexed signals. Further, each AC signal generated encodes bit values received at input node 206. In various examples, the AC signals may not be sinusoidal and may be in any suitable alternating current waveform. In some examples, the signals at input node 206 comprise a 32-bit RQL signals. In other examples, signals make take any other suitable form.

Multiplexed signal output 208 also carries a direct current (DC) bias from a DC bias source outside of the superconducting domain 201. In some examples, a feedback stage 226 in the higher temperature domain 202 is configured to provide the DC bias. Multiplexed signal output 208 is connected to a capacitor 210 configured to pass the frequency multiplexed signals towards an amplifier, such as a low-noise amplifier LNA 212, and to an inductor 218 configured to pass the DC bias signal through from the feedback stage 226 in the higher temperature domain 202. LNA 212 may improve the signal to noise ratio of the frequency multiplexed signals, and thus permit frequencies to be more closely spaced. An output of LNA 212 is connected to the higher temperature domain 202 via the transmission line 216.

The higher temperature domain 202 comprises an amplifier, such as a low-noise amplifier LNA 224, connected to an output of the transmission line 216, and a decoder 222 connected to an output of the LNA 224. Examples of circuits that may be used as decoder 222 will be discussed in more details below. Decoder 222 is configured to output associated bit values 228 that can be understood by the semiconductor memory system 230. In the example where the input node 206 comprises a 32-bit signal, associated bit values 228 comprises a 32-bit digital signal. Other suitable signal bit-widths may also be implemented.

In some examples, the superconducting domain 201 comprises an output amplifier OA 214 configured to output a sync signal that indicates when the frequency multiplexed signals on the multiplexed signal output 208 comprises valid data. The sync signal can be used for multiple multiplexed outputs (e.g. one sync signal can be used per lower temperature/higher temperature interface) in some examples. An output of OA 214 is connected to a transmission line 220. The higher temperature domain 202 further comprises a feedback stage configured to output a DC bias. As mentioned above, the plurality of superconducting oscillator circuits 204 are configured to be powered by the DC bias signal.

Figure 3:
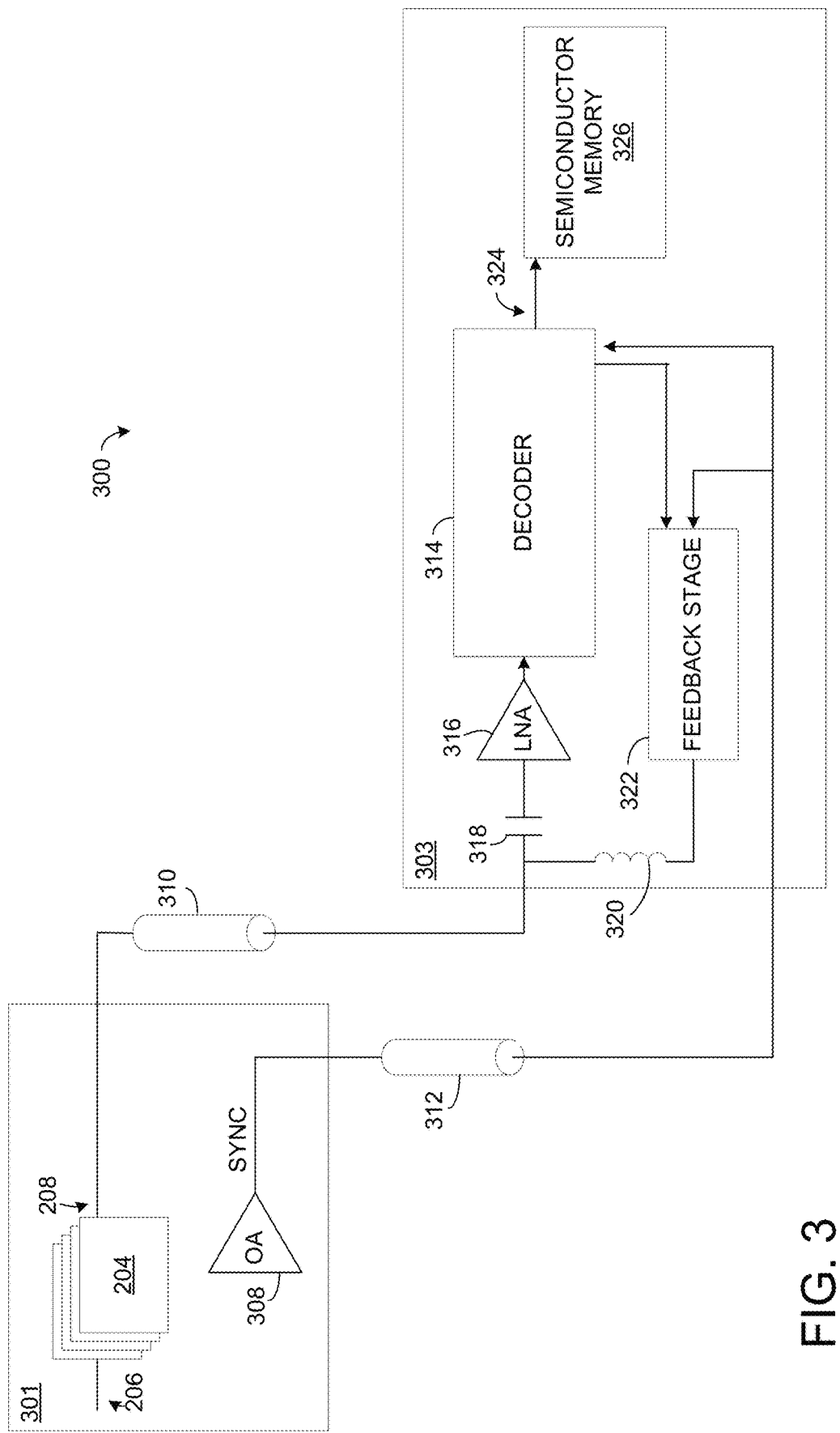
FIG. 3 shows a block diagram of another example multiplexed signal generator and corresponding decoder.

FIG. 3 shows a block diagram of another example circuit 300 configured to transmit frequency multiplexed signals from a superconducting domain 301 to a higher temperature domain 303. Circuit 300 may be implemented as part of the hybrid computing system 100 of FIG. 1. The higher temperature domain 303 comprises semiconductor logic that is configured communicate with a semiconductor memory system 326. The higher temperature domain 303 connects to the multiplexed signal output 208 via a transmission line 310, as mentioned above.

The superconducting domain 301 comprises a plurality of oscillator circuits 204 connected to an input node 206. Each oscillator output of the plurality of oscillator circuits 204 is connected to a multiplexed signal output 208. In some examples, the input node 206 comprises a 32-bit signal and the multiplexed signal output 208 comprises 32 frequency multiplexed signals. In other examples, the multiplexed signal may comprise any other suitable number of signals. The multiplexed signal output 208 further comprises a DC bias from a DC bias source outside of the superconducting domain 301. In some examples a feedback stage 322 is configured to output the DC bias.

In contrast with FIG. 2, which comprises a capacitor 210 and LNA 212 in the lower temperature superconducting domain, capacitor 318, inductor 320, and LNA 316 are located in a higher temperature domain of circuit 300. Capacitor 318 is connected to an output of the transmission line 310 and is configured to pass the frequency multiplexed signals through to LNA 316. Inductor 320 is connected to the output of the transmission line 310 to transmit a DC bias to the multiplexed signal output 208. Further, inductor 320 blocks the AC component from the multiplexed signal output 208 from entering the feedback stage 322. An output of the LNA 316 is connected to a decoder 314 configured to output associated bit values on node 324 for semiconductor memory system 326. Example circuits that may function as the decoder 314 are discussed in more detail below. In examples where the input node 206 carries a 32-bit signal, node 324 will carry a 32-bit digital signal. Other suitable signal bit-widths may also be implemented.

In some examples, the superconducting domain 301 further comprises an output amplifier OA 308 configured to output a sync signal. The sync signal comprises an indication of when the frequency multiplexed signals comprise valid data. In some examples, an output of OA 308 is connected via a transmission line 312 to the feedback stage 322 and the decoder 314.

Figure 4:
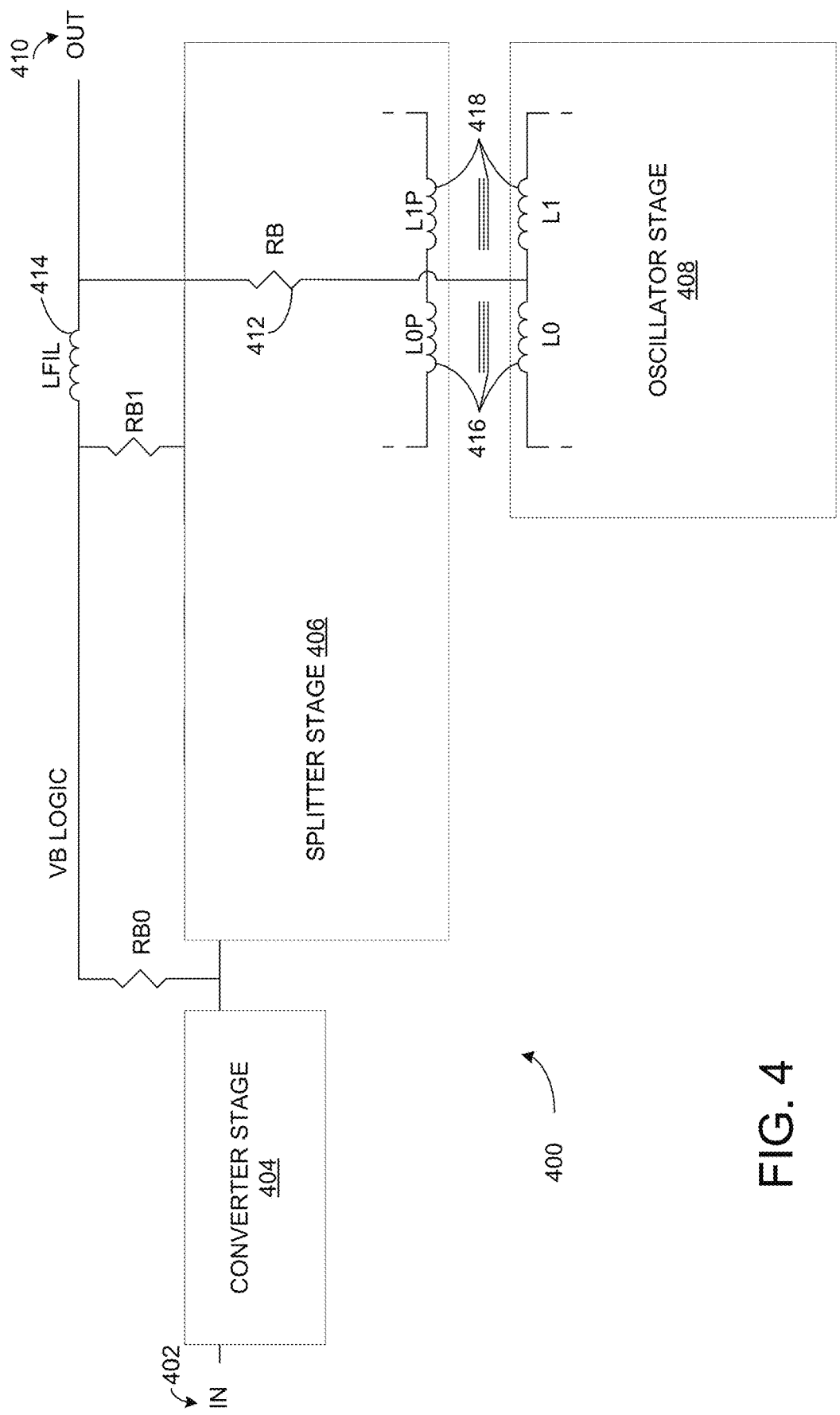
FIG. 4 shows a block diagram of an example superconducting circuit configured to generate an alternating current (AC) frequency encoded logical signal.

FIG. 4 illustrates a block diagram of an example oscillator circuit 400. Oscillator circuit 400 is an example of the superconducting oscillator circuit 204 shown in FIG. 2 and FIG. 3. Oscillator circuit 400 comprises a converter stage 404 configured to convert an input signal 402 to a Single Flux Quantum (SFQ) bit value. In some examples, the input signal 402 can be expressed as RQL logic. Oscillator circuit further comprises a splitter stage 406 connected to an output of the converter stage 404 and configured to change between a first current state and a second current state based at least in part on the SFQ bit value.

Oscillator circuit 400 further comprises an oscillator stage 408 magnetically coupled to an output of the splitter stage 406 via transformer 416 and transformer 418. The oscillator stage 408 is configured to output an AC signal comprising a selected carrier frequency by changing state based on the current state of the splitter stage 406, such that the AC signal generated encodes the SFQ bit value.

Oscillator circuit 400 further comprises resister RB 412 connected to, on a first terminal, an oscillator output 410 and on a second terminal connected to the oscillator stage 408. Oscillator output is connected to the multiplexed signal output, along with the oscillator outputs for other oscillator circuits of different frequencies. Resistor RB 412 is configured to help determine a global frequency of the oscillator stage 408, and as such any adjustments to resistor RB 412 may adjust the global frequency. In some examples, oscillator output 410 is configured to carry a DC bias to power, together with resistor RB 412, the oscillator stage 408. Resistor RB 412 can also be used as part of a feedback control loop configured to possibly reduce a long-term frequency drift of the global frequency.

In some examples, oscillator circuit 400 further comprises a filter inductor 414. A first terminal of the filter inductor 414 is connected to the oscillator output 410 and a second terminal of the filter inductor 414 is connected to the converter stage 404 and the splitter stage 406. Filter inductor 414 is configured to help prevent an AC signal from traveling from the first terminal of the filter inductor to the second terminal of the filter inductor and/or from the second terminal of the filter inductor to the first terminal of the filter inductor.

Figure 5:
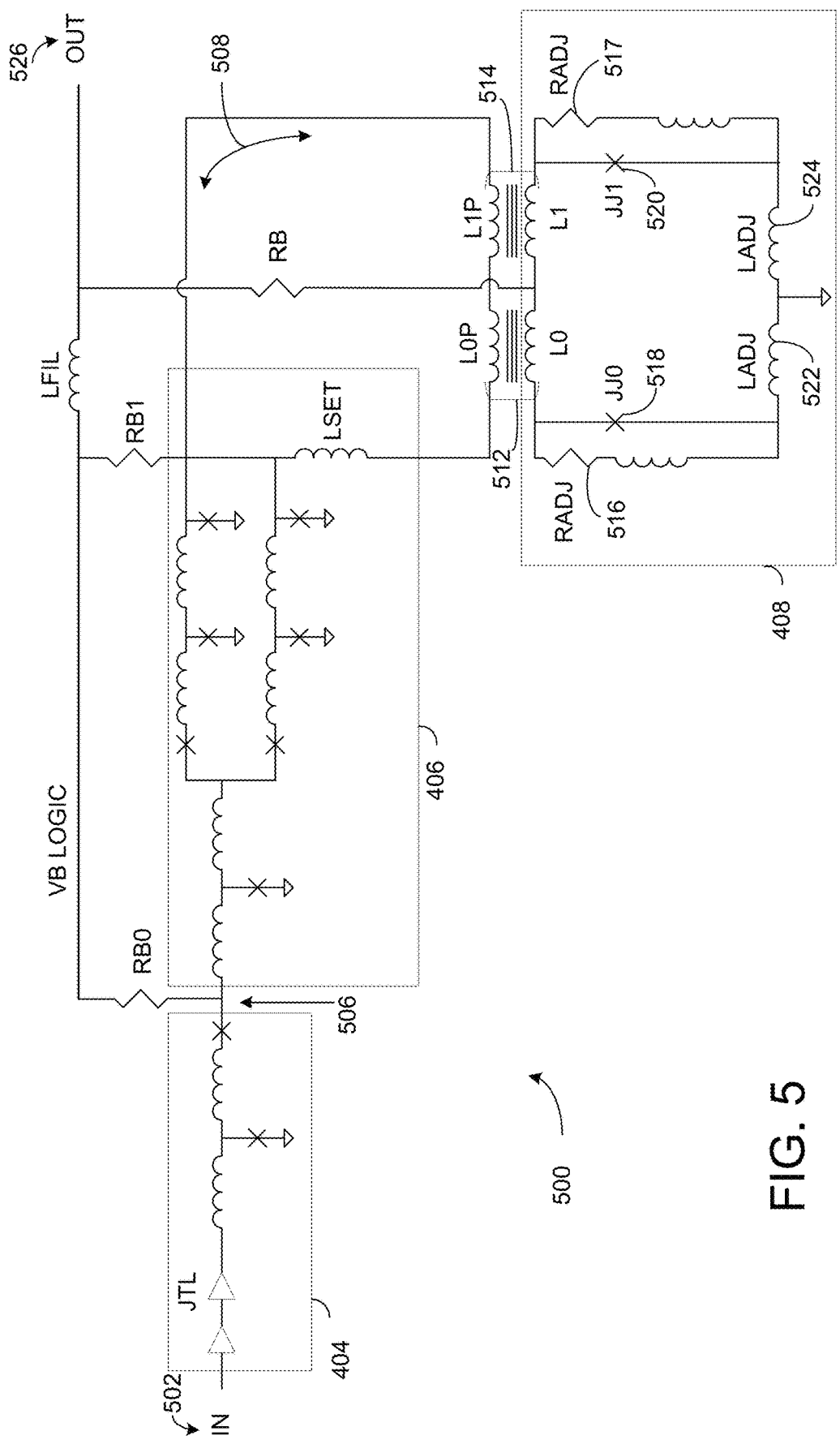
FIG. 5 shows an example circuit suitable for use as the superconducting circuit of FIG. 4.

FIG. 5 shows a more detailed example of a superconducting oscillator circuit 500, and is an example implementation of the oscillator circuit 400 of FIG. 4. Blocks representing the converter stage 404, the splitter stage 406, and the oscillator stage 408 from FIG. 4 are shown around the related circuit components in FIG. 5.

As mentioned above, a bit value of the input node 502 can be expressed using RQL logic in some examples. Thus, in such examples, the converter stage 404 is configured to convert RQL logic bit values on input node 502 to a SFQ bit value on node 506. The splitter stage 406 is configured to change between a first current state and a second current state based at least in part on the SFQ bit value on node 506. In some examples, currents of the first current state and second current state are expressed as shown by the two directions of current arrow 508. The currents flowing along current arrow 508 flow through input inductor L0P of transformer 512 and input inductor L1P of transformer 514. Current flow through the input inductor L0P of transformer 512 causes a current flow through an output inductor L0 of transformer 512. Likewise, current flow through the input inductor L1P of transformer 514 causes the current flow through the output inductor L0 of transformer 514.

In some examples, the oscillator stage 408 comprises a direct current superconducting quantum interference device (DC SQUID), including Josephson junction 518 and Josephson junction 520. The oscillator stage 408 further comprises resistor 516, inductor 522, inductor 524, and resistor 517, which combined can adjust a frequency response of the DC SQUID. As mentioned previously, the oscillator stage 408 is configured to output an AC signal comprising a different carrier frequency than the frequencies outputted by oscillator stages of other superconducting oscillator circuits. An oscillator output 526 is connected to the multiplexed frequency output along with outputs of other superconducting oscillator circuits, thereby creating the frequency multiplexed signals from the plurality of oscillator circuits as previously mentioned.

Figure 6:
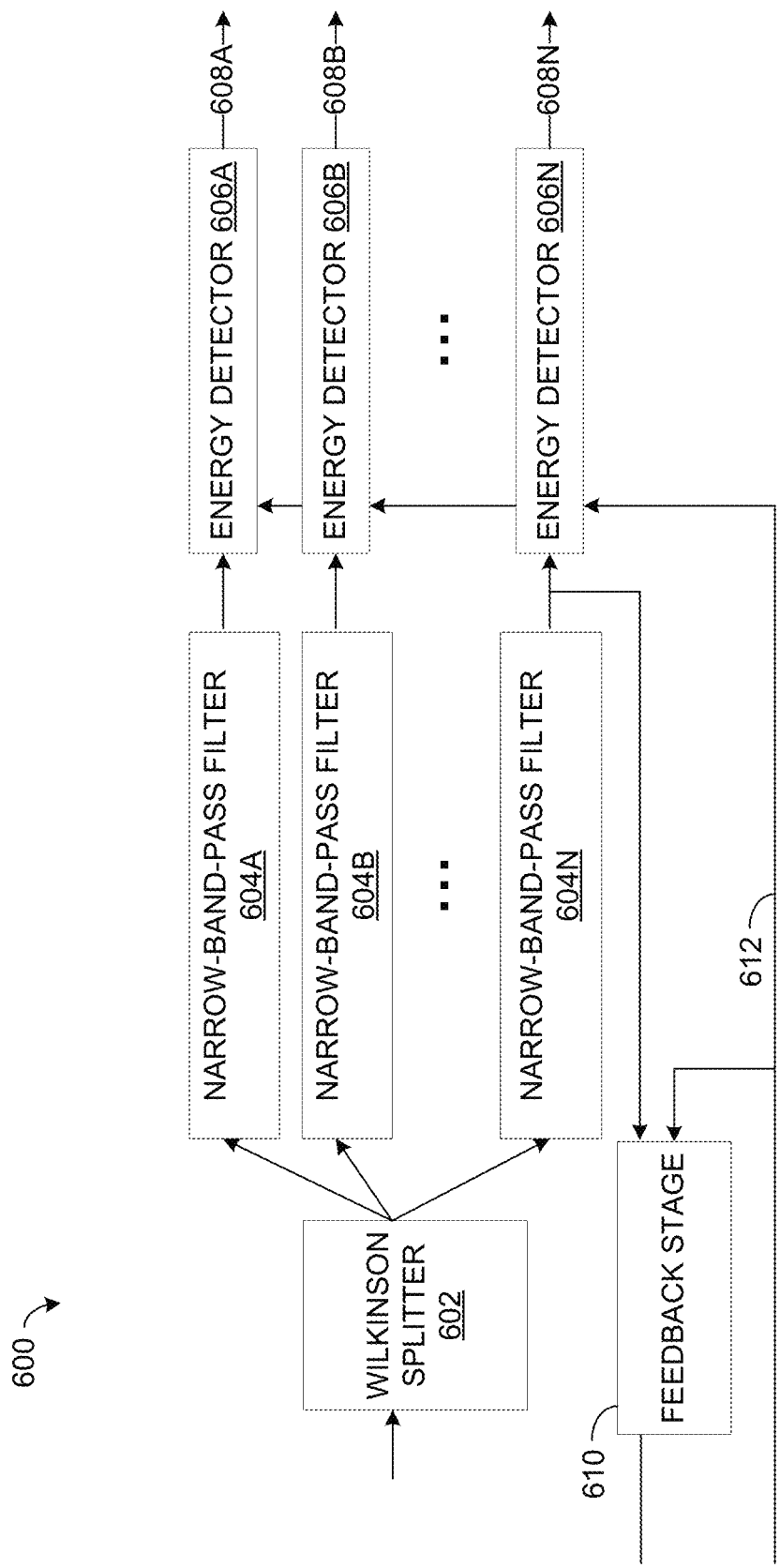
FIG. 6 shows a block diagram of an example decoder circuit.

The frequency multiplexed signals are transmitted from the superconducting domain to the higher temperature domain, where they are decoded. FIG. 6 shows a block diagram of an example decoder 600 with a feedback stage 610. Decoder 600 is an example of a suitable circuit for decoder 314 in FIG. 3 or decoder 222 in FIG. 2, as examples. Decoder 600 comprises a Wilkinson splitter 602, a plurality of narrow band-pass-filters 604, and a plurality of energy detectors 606, each energy detector 606 being connected to one of the band-pass-filters 604. The plurality of narrow-band-pass filters are shown as 604A to 604N, where 604N represents a total number of narrow-band-pass filters. In examples where a 32 bit signal is on the input of the plurality of superconducting oscillator circuits from FIG. 2, decoder 600 can have a corresponding 32 narrow-band-pass filters and 32 energy detectors. The system also has a $33^{rd}$ channel that is always-on, as described below.

An input of decoder 600 receives frequency multiplexed signals. Wilkinson splitter 602 is configured to create multiple copies of the frequency multiplexed signals. Each copy of the frequency multiplexed signal is connected to an input of a corresponding bandpass filter 604, which is configured to filter out a corresponding frequency from the frequency multiplexed signals. Each energy detector stage 606 is configured to output an associated bit value 608 based at least in part on the different carrier frequency filtered. The plurality of associated bit values 608 can be sent to a semiconductor memory system. Decoder 600 further comprises an optional sync signal line 612 as an input that is connected to an input of each of the plurality of energy detectors 606 and an input of the feedback stage 610. The plurality of energy detectors 606 may use the sync signal to control sampling of the different carrier frequencies filtered and may help in generating digital signals of the associated bit values 608. In some examples, the sync signal comprises an indication that the data on the frequency multiplexed signals are valid.

In some examples, one of the frequency multiplexed signals is an always-on signal. In FIG. 6, an example always-on signal is illustrated in decoder 600 as bit N. In examples where a 32 bit signal is on the input of the plurality of superconducting oscillator circuits from FIG. 2, a $33^{rd}$ channel can be the always-on signal. The output of the narrow-band-filter 604N of the always-on signal is connected to an input of the feedback stage 610. In some examples, the feedback stage 610 is configured to monitor an average frequency of the always-on signal against a nominal expected value. In those examples, the feedback stage 610 is further configured to output a feedback signal comprising a value of the DC bias.

Figure 7:
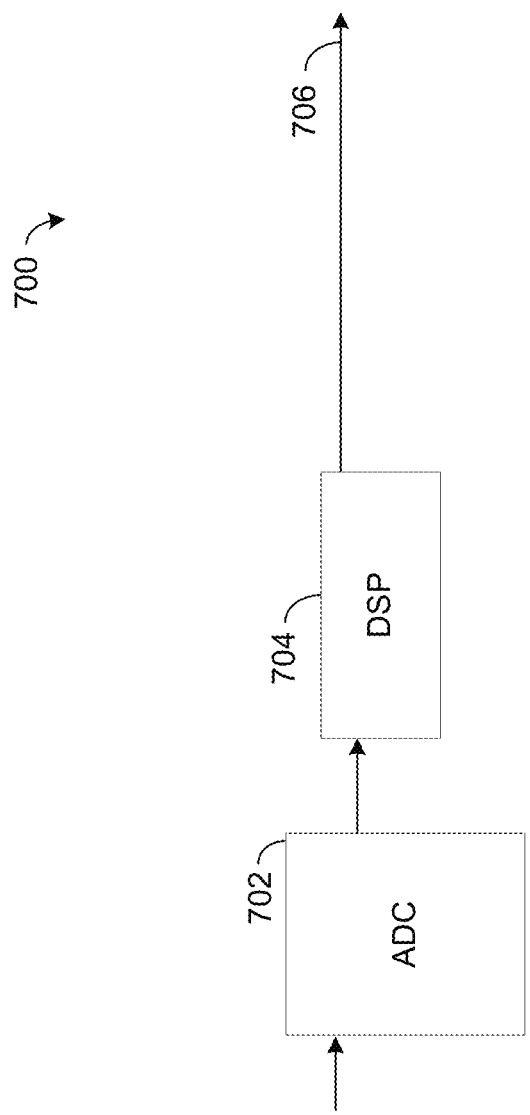
FIG. 7 shows a block diagram of another example decoder circuit.

Instead of using an arrangement of parallel bandpass filters, other example decoder circuits may utilize any other suitable decoding circuitry. FIG. 7 shows another example decoder 700 comprising an analog to digital (ADC) converter 702 and a digital signal processing (DSP) stage 704. The ADC 702 is configured to convert the frequency multiplexed signals to digital signals. The DSP stage 704 is configured to perform a discrete Fourier transform (DFT) on the digital signals to determine associated bit values 706 for each of the corresponding frequencies extracted from the frequency multiplexed signals. The associated bit values 706 can be directed toward a semiconductor memory system.

Figure 8:
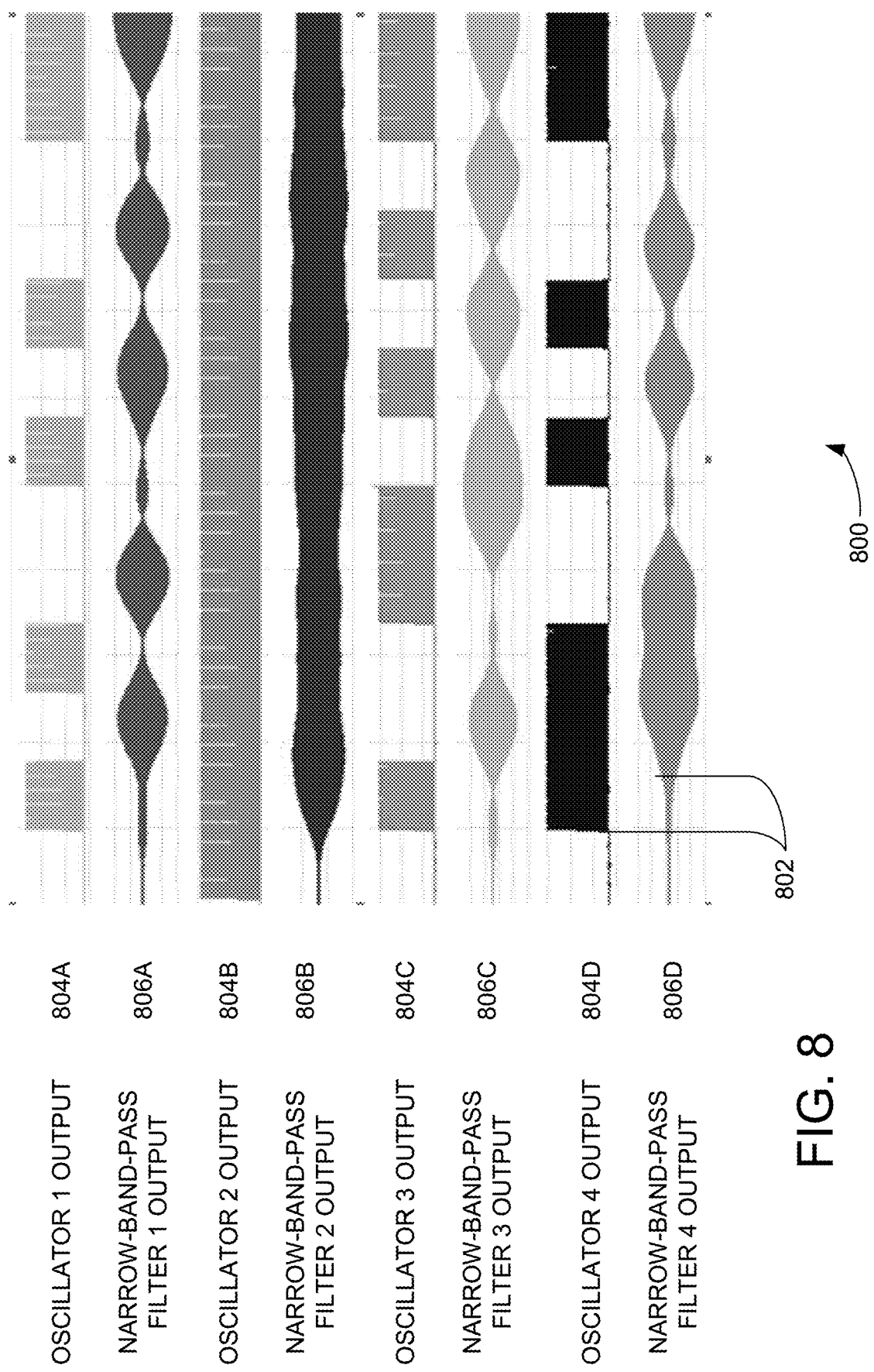
FIG. 8 shows a spectrum plot illustrating examples of frequency encoded signals produced by the circuits of FIG. 5 and FIG. 6.

FIG. 8 shows example spectrum plot 800 illustrating encoded bit values at a location in an oscillator circuit and associated bit values at a location in a decoder circuit. For simplicity, only 4 bits are shown, but any suitable number of bits may be used and exhibit similar timing. Oscillator outputs 804A, 804B, 804C, and 804D show encoded bit values as seen at an oscillator output of a corresponding oscillator circuit, such as superconducting oscillator circuit 204, oscillator circuit 400, or oscillator circuit 500 for example. Each oscillator output 804 is shown individually in spectrum plot 800 before multiplexing, wherein each oscillator output, 804A, 804B, 804C, and 804D comprises a different carrier frequency and encodes a different set of bit values.

Spectrum plot 800 further illustrates narrow-band-pass filter outputs 806A, 806B, 806C, and 806D as seen on an output of a narrow-band-pass such as in example decoder 600. Timing delay 802, between oscillator 4 output 804D and narrow-band-pass filter 4 output 806D, may be from delays due to circuit and/or transmission line components. As such, timing delay 802 can vary between different implementations. Similar timing delay 802 can be seen for the other oscillator outputs 804 and narrow-band-pass filter outputs 806. Accounting for the timing delay 802, digital associated bit values can be extracted from the narrow-band-pass filter outputs 806, for example by the energy detectors in decoder 600. In some cases, the energy detectors may receive a sync signal as described above to help sample the narrow-band-pass filter outputs in order to extract the digital associated bit values. Thus, a plurality of oscillator circuits may generate AC signals that encode bit values on the oscillator outputs 804 and then multiplex the AC signals into frequency multiplexed signals. Further, a decoder circuit comprising a plurality of narrow-band-pass filter outputs 806 may extract digital associated bits in a form that can be understood by a semiconductor memory system.

Spacing between individual channels (carrier frequency bands) of the spectrum plot 800 can be determined based at least in part upon a cost of the low-noise-amplifier (LNA) and other radio frequency (RF) components related to their upper operating frequency, a bandwidth of the inter-connect between the superconducting and higher temperature domains, and a system resonator clock frequency, such as the system clock of the logic in the superconducting domain. The upper frequency limit of the channels may be a function of the LNA and RF components and the bandwidth of the inter-connect between the temperature domains, and the lower frequency limit of the channels may be a function of the system resonator clock frequency. Further, a number of channels that can be placed between the upper and lower frequency limits is a function of the narrow-band filter, inter-channel attenuation, and the spectral purity of the DC SQUID oscillators.

Figure 9:
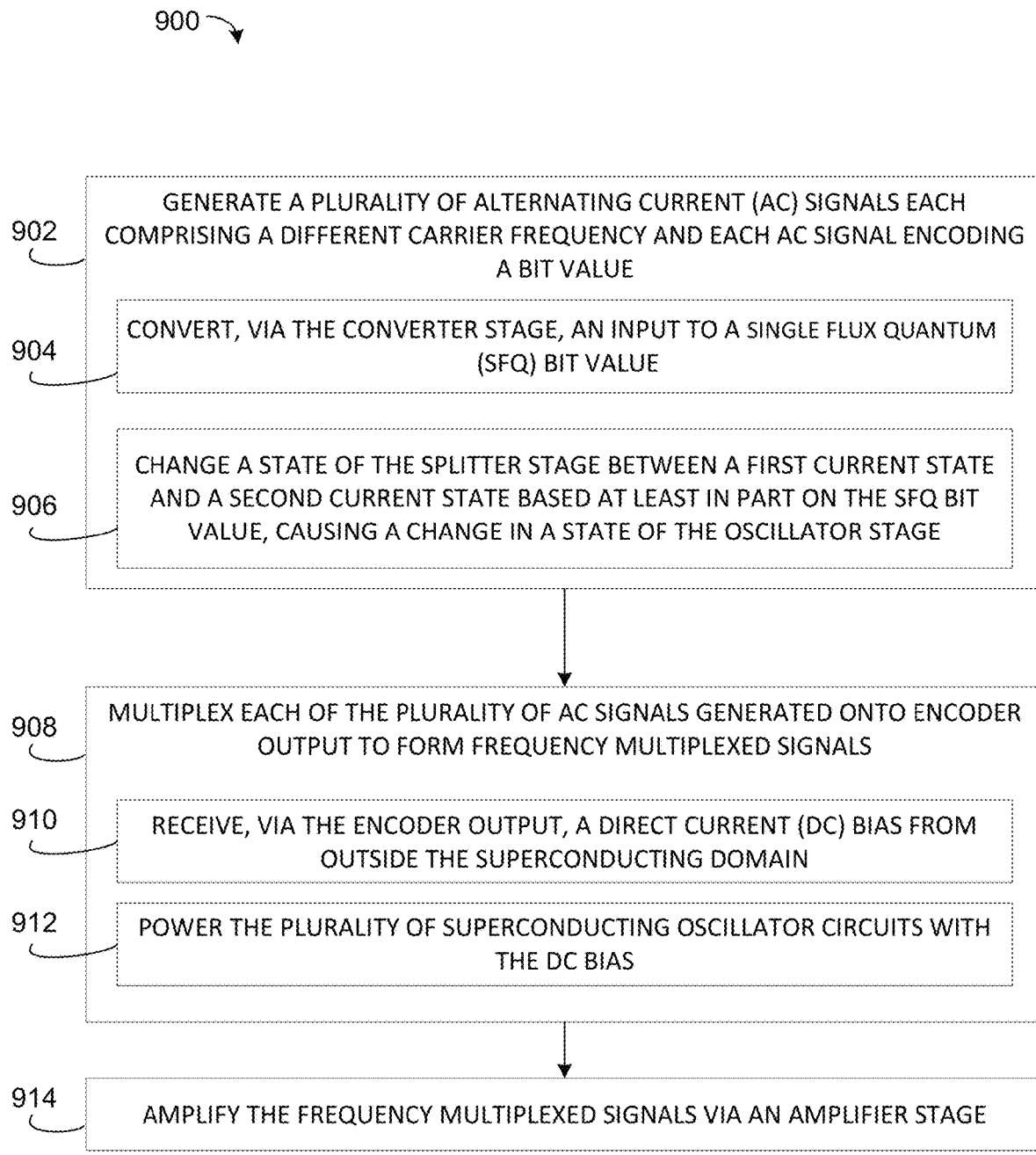
FIG. 9 shows a flow diagram depicting an example method of transmitting frequency multiplexed signals from a superconducting domain to a higher temperature domain.

FIG. 9 shows a flow diagram depicting example method 900 for transmitting frequency multiplexed signals from a superconducting domain to a higher temperature domain. For example, method 900 may be performed on any circuits shown in FIGS. 2-5 or computing system shown in FIG. 1 and as described herein. Method 900 comprises, at 902, generating a plurality of alternating current (AC) signals each comprising a different carrier frequency and each AC signal encoding a bit value. For each AC signal, method 900 comprises, at 904, converting, via the converter stage, an input to a Single Flux Quantum (SFQ) bit value and, at 906, changing a state of the splitter stage between a first current state and a second current state based at least in part on the SFQ bit value, causing a change in a state of the oscillator stage. The change in the state of the oscillator stage encodes the SFQ bit value into a carrier frequency of the superconducting oscillator circuit to generate the AC signal for the superconducting oscillator circuit.

Method 900 further comprises, at 908, multiplexing each of the plurality of AC signals generated onto a multiplexed signal output to form the frequency multiplexed signals. At 910, method 900 further comprises receiving, via the multiplexed signal output, a direct current (DC) bias from outside the superconducting domain. In the examples where the DC bias is received, method 900 comprises, at 912, powering the plurality of superconducting oscillator circuits with the DC bias. Further, in some examples, method 900 comprises, at 914, amplifying the frequency multiplexed signals via an amplifier stage, such as a low-noise amplifier. The amplifier stage may be in one or more of the superconducting domain and the higher temperature domain.

Figure 10:
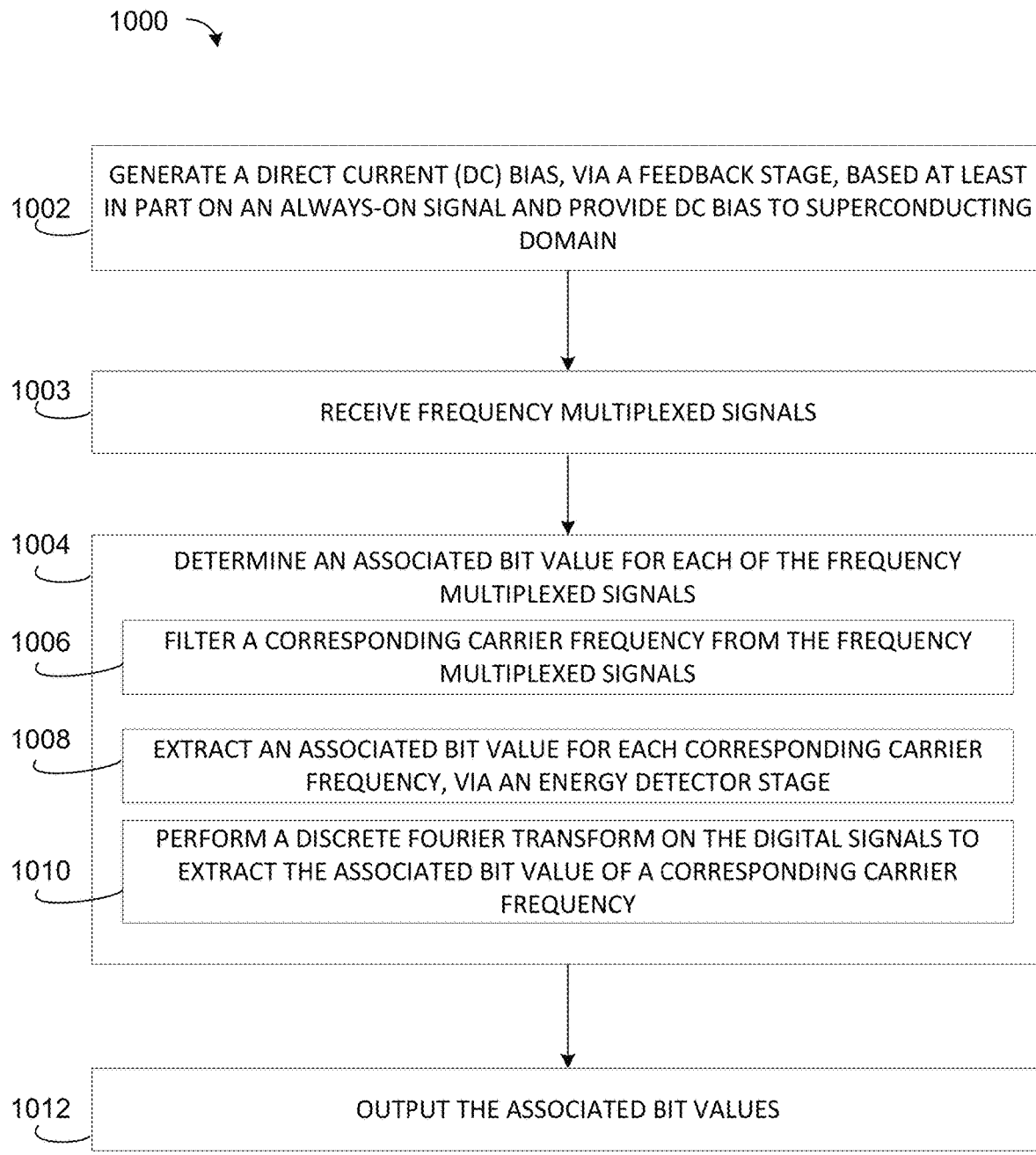
FIG. 10 shows a flow diagram depicting an example method of receiving and decoding frequency multiplexed signals from a superconducting domain to a higher temperature domain.

FIG. 10 illustrates a flow diagram depicting example method 1000 for receiving and decoding frequency multiplexed signals from a superconducting domain to a higher temperature domain. For example, method 1000 may be perform on any circuits shown in FIGS. 2-3 and FIGS. 6-7 or computing system shown in FIG. 1 and as described herein. In some examples, one of the frequency multiplexed signals is an always-on signal. In such examples, method 1000 comprises, at 1002, generating a direct current (DC) bias, via a feedback stage, based at least in part on the always-on signal.

Method 1000 further comprises receiving frequency multiplex signals at 1003. The frequency multiplex signals are received in the higher temperature domain and can originate in the superconducting domain. Further the frequency multiplex signals may be generated by multiplexing the oscillator outputs 804 of spectrum plot 800, for example. Method 1000 further comprises, at 1004, determining an associated bit value for each of the frequency multiplexed signals. In some examples, method 1000 determines the associated bit values by, at 1006, filtering carrier frequencies from the frequency multiplexed signals, and at 1008, extracting the associated bit value for each carrier frequency via an energy detector stage. In these examples, the decoder circuit may be similar to decoder 600 in design. In other examples, method 1000, comprises, at 1010, performing a discrete Fourier transform on the frequency multiplexed signals to extract the associated bit value of a corresponding carrier frequency. Each corresponding carrier frequency relates to one of the different carrier frequencies. The discrete Fourier transform may be performed by a digital signal processing (DSP) stage as shown in decoder 700. Further, method 1000 comprises, at 1012, outputting the associated bit values. The associated bit values may be readable by a semiconductor memory system.

Another example provides a circuit configured to transmit frequency multiplexed signals from a superconducting domain to a higher temperature domain. The circuit comprising a multiplexed signal output; and a plurality of superconducting oscillator circuits each configured to output a different carrier frequency, each superconducting oscillator circuit comprising an oscillator output connected to the multiplexed signal output, and each superconducting oscillator circuit comprising a converter stage configured to convert an input of a superconducting logic signal to a Single Flux Quantum (SFQ) bit value, a splitter stage electrically connected to an output of the converter stage, the splitter stage configured to change between a first current state and a second current state based at least in part on the SFQ bit value, and an oscillator stage magnetically coupled to an output of the splitter stage and electrically coupled to the oscillator output, the oscillator stage comprising a direct current superconducting quantum interference device (DC SQUID). In some such examples, the multiplexed signal output is alternatively or additionally configured to carry a direct current (DC) bias from a DC bias source outside of the superconducting domain, and the plurality of superconducting oscillator circuits are further configured to be powered by the DC bias. In some such examples, the circuit alternatively or additionally comprises a decoder circuit located in the higher temperature domain and connected to the multiplexed signal output, the decoder circuit configured to extract a plurality of corresponding carrier frequencies from the frequency multiplexed signals and determine an associated bit value for each of the corresponding carrier frequencies. In some such examples, the circuit alternatively or additionally comprises a capacitor electrically connected to the multiplexed signal output; an inductor electrically connected to the multiplexed signal output and an input of the inductor electrically connected to the DC bias source; and a low-noise amplifier electrically connected to an output of the capacitor and an output of the low-noise amplifier electrically connected to the decoder circuit. In some such examples the low-noise amplifier alternatively or additionally is a first low-noise amplifier in the superconducting domain, the circuit alternatively or additionally comprises a second low-noise amplifier in the higher temperature domain, the output of the first low-noise amplifier is alternatively or additionally connected to an input of the second low-noise amplifier and an output of the second low-noise amplifier is connected to the decoder circuit, and wherein the capacitor is in the superconducting domain. In some such examples, the capacitor, the inductor, and the low-noise amplifier are alternatively or additionally in the higher temperature domain.

Another example provides a circuit configured to transmit frequency multiplexed signals from a superconducting domain to a higher temperature domain. The circuit comprises a multiplexed signal output configured to conduct the frequency multiplexed signals and to carry a direct current (DC) bias from a DC bias source outside of the superconducting domain; and a plurality of superconducting oscillator circuits each configured to be powered by the DC bias and to output a different carrier frequency, each superconducting oscillator circuit comprising an oscillator output connected to the multiplexed signal output, and each superconducting oscillator circuit comprising a converter stage configured to convert an input of the superconducting oscillator circuit to a Single Flux Quantum (SFQ) bit value, a splitter stage electrically connected to an output of the converter stage, the splitter stage configured to change between a first current state and a second current state based at least in part on the SFQ bit value, and an oscillator stage magnetically coupled to an output of the splitter stage and electrically coupled to the oscillator output, the oscillator stage comprising a direct current superconducting quantum interference device (DC SQUID). In some such examples, the circuit alternately or additionally comprises a decoder circuit in the higher temperature domain and connected to the multiplexed signal output, the decoder circuit configured to extract a plurality of corresponding carrier frequencies from the frequency multiplexed signals and determine an associated bit value for each of the different carrier frequencies. In some such examples, the circuit alternatively or additionally comprises a capacitor electrically connected to the multiplexed signal output; an inductor electrically connected to the multiplexed signal output and an input of the inductor electrically connected to the DC bias source; and a low-noise amplifier electrically connected to an output of the capacitor and an output of the low-noise amplifier connected to the decoder circuit. In some such examples, the circuit alternately or additionally comprises a feedback stage configured to provide the DC bias, and wherein an input of the feedback stage is connected to the decoder, and an output of the feedback stage is connected to the inductor. In some such examples, the decoder circuit alternatively or additionally comprises a Wilkinson splitter stage configured to create multiple copies of the frequency multiplexed signals, a plurality of narrow-band-pass filters, each connected to a corresponding output of the Wilkinson splitter stage and configured to filter one of the corresponding carrier frequencies from the frequency multiplexed signals, and a plurality of energy detector stages, each connected to an output of a separate one of the plurality of narrow-band-pass filters, and each energy detector stage configured to output the associated bit value based at least in part on the different carrier frequency filtered. In some such examples, the decoder circuit alternatively or additionally comprises an analog-to-digital converter (ADC) stage, and a digital signal processing (DSP) stage connected to an output of the ADC stage, the DSP stage configured to perform a discrete Fourier transform (DFT) on the output of the ADC stage to extract the associated bit value for each carrier frequency. In some such examples each superconducting oscillator circuit alternatively or additionally comprises a filter inductor electrically connected to the oscillator output.

Another example provides a method for transmitting frequency multiplexed signals from a superconducting domain to a higher temperature domain, the superconducting domain comprising a circuit comprising a multiplexed signal output and a plurality of superconducting oscillator circuits each comprising a converter stage, a splitter stage, an oscillator stage, and an oscillator output connected to the multiplexed signal output. The method comprises generating a plurality of alternating current (AC) signals each comprising a different carrier frequency by, for each superconducting oscillator circuit: converting, via the converter stage, an input to a Single Flux Quantum (SFQ) bit value; changing a state of the splitter stage between a first current state and a second current state based at least in part on the SFQ bit value, causing a change in a state of the oscillator stage and thereby encoding the SFQ bit value into a carrier frequency of the superconducting oscillator circuit to generate the AC signal for the superconducting oscillator circuit; and multiplexing each of the plurality of AC signals generated onto the multiplexed signal output to form the frequency multiplexed signals. In some such examples, the method alternatively or additionally comprises amplifying the frequency multiplexed signals via a low-noise amplifier stage. In some such examples, the method alternately or additionally comprises receiving, via the multiplexed signal output, a direct current (DC) bias from outside the superconducting domain, and powering the plurality of superconducting oscillator circuits with the DC bias. In some such examples, the higher temperature domain alternatively or additionally comprises a decoder circuit, and the method further comprising, via the decoder circuit, determining an associated bit value for each of the frequency multiplexed signals, and outputting the associated bit value. In some such examples, decoding alternatively or additionally comprises, via the decoder circuit, filtering, a corresponding carrier frequency from the frequency multiplexed signals, each corresponding carrier frequency related to one of the different carrier frequencies. In some such examples, decoding alternatively or additionally comprises, via the decoder circuit, converting the frequency multiplexed signals into digital signals and performing a discrete Fourier transform on the digital signals to extract the associated bit value of a corresponding carrier frequency, each corresponding carrier frequency related to one of the different carrier frequencies. In some such examples, one of the frequency multiplexed signals is alternatively or additionally an always-on signal; and the method further comprising generating a direct current (DC) bias, via a feedback stage, based at least in part on the always-on signal.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A circuit configured to transmit frequency multiplexed signals from a superconducting domain to a higher temperature domain, the circuit comprising:
    a multiplexed signal output; and
    a plurality of superconducting oscillator circuits each configured to output a different carrier frequency, each superconducting oscillator circuit comprising an oscillator output connected to the multiplexed signal output, and each superconducting oscillator circuit comprising
        a converter stage configured to convert an input of a superconducting logic signal to a Single Flux Quantum (SFQ) bit value,
        a splitter stage electrically connected to an output of the converter stage, the splitter stage configured to change between a first current state and a second current state based at least in part on the SFQ bit value, and
        an oscillator stage magnetically coupled to an output of the splitter stage and electrically coupled to the oscillator output, the oscillator stage comprising a direct current superconducting quantum interference device (DC SQUID).

2. The circuit of claim 1, wherein the multiplexed signal output is further configured to carry a direct current (DC) bias from a DC bias source outside of the superconducting domain, and the plurality of superconducting oscillator circuits are further configured to be powered by the DC bias.

3. The circuit of claim 2, further comprising a decoder circuit located in the higher temperature domain and connected to the multiplexed signal output, the decoder circuit configured to extract a plurality of corresponding carrier frequencies from the frequency multiplexed signals and determine an associated bit value for each of the corresponding carrier frequencies.

4. The circuit of claim 3, further comprising
    a capacitor electrically connected to the multiplexed signal output;
    an inductor electrically connected to the multiplexed signal output and an input of the inductor electrically connected to the DC bias source; and
    a low-noise amplifier electrically connected to an output of the capacitor and an output of the low-noise amplifier electrically connected to the decoder circuit.

5. The circuit of claim 4, wherein the low-noise amplifier is a first low-noise amplifier in the superconducting domain, wherein the circuit further comprises a second low-noise amplifier in the higher temperature domain, wherein the output of the first low-noise amplifier is connected to an input of the second low-noise amplifier and an output of the second low-noise amplifier is connected to the decoder circuit, and wherein the capacitor is in the superconducting domain.

6. The circuit of claim 4, wherein the capacitor, the inductor, and the low-noise amplifier are in the higher temperature domain.

7. A circuit configured to transmit frequency multiplexed signals from a superconducting domain to a higher temperature domain, the circuit comprising:
    a multiplexed signal output configured to conduct the frequency multiplexed signals and to carry a direct current (DC) bias from a DC bias source outside of the superconducting domain; and
    a plurality of superconducting oscillator circuits each configured to be powered by the DC bias and to output a different carrier frequency, each superconducting oscillator circuit comprising an oscillator output connected to the multiplexed signal output, and each superconducting oscillator circuit comprising
        a converter stage configured to convert an input of the superconducting oscillator circuit to a Single Flux Quantum (SFQ) bit value,
        a splitter stage electrically connected to an output of the converter stage, the splitter stage configured to change between a first current state and a second current state based at least in part on the SFQ bit value, and
        an oscillator stage magnetically coupled to an output of the splitter stage and electrically coupled to the oscillator output, the oscillator stage comprising a direct current superconducting quantum interference device (DC SQUID).

8. The circuit of claim 7, further comprising a decoder circuit in the higher temperature domain and connected to the multiplexed signal output, the decoder circuit configured to extract a plurality of corresponding carrier frequencies from the frequency multiplexed signals and determine an associated bit value for each of the different carrier frequencies.

9. The circuit of claim 8, further comprising
    a capacitor electrically connected to the multiplexed signal output;
    an inductor electrically connected to the multiplexed signal output and an input of the inductor electrically connected to the DC bias source; and a low-noise amplifier electrically connected to an output of the capacitor and an output of the low-noise amplifier connected to the decoder circuit.

10. The circuit of claim 9, further comprising a feedback stage configured to provide the DC bias, and wherein
an input of the feedback stage is connected to the decoder, and
an output of the feedback stage is connected to the inductor.

11. The circuit of claim 8, wherein the decoder circuit comprises
a Wilkinson splitter stage configured to create multiple copies of the frequency multiplexed signals,
a plurality of narrow-band-pass filters, each connected to a corresponding output of the Wilkinson splitter stage and configured to filter one of the corresponding carrier frequencies from the frequency multiplexed signals, and
a plurality of energy detector stages, each connected to an output of a separate one of the plurality of narrow-band-pass filters, and each energy detector stage configured to output the associated bit value based at least in part on the different carrier frequency filtered.

12. The circuit of claim 8, wherein the decoder circuit comprises
an analog-to-digital converter (ADC) stage, and
a digital signal processing (DSP) stage connected to an output of the ADC stage, the DSP stage configured to perform a discrete Fourier transform (DFT) on the output of the ADC stage to extract the associated bit value for each carrier frequency.

13. The circuit of claim 7, wherein each superconducting oscillator circuit further comprises a filter inductor electrically connected to the oscillator output.

14. A method for transmitting frequency multiplexed signals from a superconducting domain to a higher temperature domain, the superconducting domain comprising a circuit comprising a multiplexed signal output and a plurality of superconducting oscillator circuits each comprising a converter stage, a splitter stage, an oscillator stage, and an oscillator output connected to the multiplexed signal output, the method comprising:
generating a plurality of alternating current (AC) signals each comprising a different carrier frequency by, for each superconducting oscillator circuit:
converting, via the converter stage, an input to a Single Flux Quantum (SFQ) bit value;
changing a state of the splitter stage between a first current state and a second current state based at least in part on the SFQ bit value, causing a change in a state of the oscillator stage and thereby encoding the SFQ bit value into a carrier frequency of the superconducting oscillator circuit to generate the AC signal for the superconducting oscillator circuit; and
multiplexing each of the plurality of AC signals generated onto the multiplexed signal output to form the frequency multiplexed signals.

15. The method of claim 14, further comprising amplifying the frequency multiplexed signals via a low-noise amplifier stage.

16. The method of claim 14, further comprising
receiving, via the multiplexed signal output, a direct current (DC) bias from outside the superconducting domain, and
powering the plurality of superconducting oscillator circuits with the DC bias.

17. The method of claim 14, wherein the higher temperature domain comprises a decoder circuit, and
the method further comprising, via the decoder circuit, determining an associated bit value for each of the frequency multiplexed signals, and outputting the associated bit value.

18. The method of claim 17, wherein decoding comprises, via the decoder circuit, filtering, a corresponding carrier frequency from the frequency multiplexed signals, each corresponding carrier frequency related to one of the different carrier frequencies.

19. The method of claim 17, wherein decoding comprises, via the decoder circuit,
converting the frequency multiplexed signals into digital signals and
performing a discrete Fourier transform on the digital signals to extract the associated bit value of a corresponding carrier frequency, each corresponding carrier frequency related to one of the different carrier frequencies.

20. The method of claim 17, wherein one of the frequency multiplexed signals is an always-on signal; and
the method further comprising generating a direct current (DC) bias, via a feedback stage, based at least in part on the always-on signal.

* * * * *